United States Patent
Sauter et al.

(10) Patent No.: US 7,561,000 B2
(45) Date of Patent: Jul. 14, 2009

(54) OSCILLATOR CIRCUIT FOR A SENSOR

(75) Inventors: Melnrad Sauter, Neukirch (DE);
Jean-Luc Lamarche, Mittelhausbergen (FR)

(73) Assignee: i f m electronic GmbH, Essen (DE)

( * ) Notice: Subject to any disclaimer, the term of this patent is extended or adjusted under 35 U.S.C. 154(b) by 517 days.

(21) Appl. No.: 11/180,904

(22) Filed: Jul. 14, 2005

(65) Prior Publication Data
US 2006/0012443 A1 Jan. 19, 2006

(30) Foreign Application Priority Data
Jul. 14, 2004 (DE) .................. 10 2004 034 190

(51) Int. Cl.
*H03B 5/08* (2006.01)
(52) U.S. Cl. ............. 331/167; 331/117 R; 331/117 FE; 324/655
(58) Field of Classification Search ................. 331/167, 331/158, 117 R, 117 FE; 324/655
See application file for complete search history.

(56) References Cited
U.S. PATENT DOCUMENTS
5,063,359 A * 11/1991 Leonowich ........... 331/116 FE

OTHER PUBLICATIONS

Schiff, A., Inductive and Capacitive Sensors, the Library of Engineering, vol. 24, Verlag Moderne Industrie, 1989; pp. 4-23.
Tietz, U., Schenk Ch., Semiconductor Circuit Engineering, 12$^{th}$ Edition, Springer Verlag, 2002, p. 874.

* cited by examiner

*Primary Examiner*—Arnold Kinkead
(74) *Attorney, Agent, or Firm*—David S. Safran; Roberts Mlotkowski; Safran & Cole, P.C.

(57) ABSTRACT

An oscillator circuit for a sensor, with a tuned circuit and an operational amplifier, the electrical oscillation of the tuned circuit is capable of being tapped between a first terminal and a second terminal of the tuned circuit, and the first terminal of the tuned circuit being connected to the noninverting input of the operational amplifier and the output of the operational amplifier is fed back to the noninverting input of the operational amplifier. The oscillator circuit is designed to improve the dynamic behavior of the oscillator circuit by the second terminal of the tuned circuit —at least in terms of AC voltage —being directly connected to the inverting input of the operational amplifier.

16 Claims, 3 Drawing Sheets

OSCILLATOR CIRCUIT FOR A SENSOR

BACKGROUND OF THE INVENTION

1. Field of Invention

The invention relates to an oscillator circuit for a sensor, with a tuned circuit and an operational amplifier, the electrical oscillation of the tuned circuit capable of being tapped between a first terminal and a second terminal of the tuned circuit and the first terminal of the tuned circuit being connected to the noninverting input of the operational amplifier and the output of the operational amplifier being fed back to the noninverting input of the operational amplifier.

2. Description of Related Art

Oscillator circuits of the type under consideration here have long been known in different embodiments and are used in circuit engineering wherever electrical oscillations (generally periodic characteristics of electrical voltages) are used, and for example, they are used as clocks for a circuit as a carrier of information or as periodic test signals.

One common application for these oscillator circuits is use in proximity sensors, for example, in measurement devices and proximity switches with an inductive, capacitive and/or resistive sensor element. The necessity of using oscillators here is based on the effect that the electrical oscillation caused by a tuned circuit likewise changes when certain characteristics of the tuned circuit which can be influenced from the outside change, and this change of oscillation can be used for further evaluation.

The conventional use of an oscillator circuit is explained below using the example of an inductive proximity sensor; however, analogous effects can also be observed in capacitive or resistive sensors or sensor elements.

Oscillator circuits conventionally have a tuned circuit, such as, for example, a harmonic tuned circuit in the form of a LRC network. The electrical oscillation of the tuned circuit is conventionally amplified by means of an amplifier circuit and looped back again to the tuned circuit, so that the tuned circuit, under certain conditions, tends to sustained oscillation. For proximity sensors, either the capacitor or the coil of the tuned circuit is made such that the capacitance of the capacitor or the quality of the coil can be easily influenced by a conductive article, for example, a metal part, approaching the respective sensor. In the case of an inductively operating sensor, the approach of a conductive article to the sensor causes the stray field of the coil of the tuned circuit to induce an eddy current in the conductive article which takes energy from the electromagnetic field of the coil, and thus, attenuates the tuned circuit. The resulting change in amplitude of the electrical oscillation of the tuned circuit is thus an indicator for the change of the quality of the tuned circuit and it is indirectly a measure of the approach of the conductive article to the sensor itself. The attenuation of the tuned circuit in the simple oscillator circuit under discussion here leads to the electrical oscillation of the tuned circuit coming completely to a standstill. The structure and manner of operation of the inductive sensor is known and is common in industrial use (Schiff, A.: *Inductive and Capacitive Sensors*, The Library of Engineering, vol. 24, Verlag Moderne Industrie, 1989; Tietze, U., Schenk Ch.: *Semiconductor Circuit Engineering*, 12th edition. Springer Verlag, 2002, page 874).

As is recognized, a sustained oscillation only occurs when the feedback signal has the amplitude of the input signal, i.e., when the amplifier compensates for possible transmission losses and when the positive feedback signal in the case of positive feedback is in phase with the input signal, or in the case of negative feedback is phase-shifted 180° to this signal. The described eddy current losses reduce the total gain of the oscillator circuit, by which, ultimately for the case in which the conductive article is in the influence area of the electromagnetic stray field, the oscillation condition for the tuned circuit is no longer satisfied, and therefore, the electrical oscillation comes to a standstill.

The oscillator circuit which is described here and which is also known in modifications inherently has certain disadvantages, but especially in conjunction with the described sensors. One disadvantage is the inevitable chopping of the electrical oscillation of the oscillator circuit. Since oscillators require a certain build-up time in order to shift from a nonoscillating state into an oscillating state, such a sensor or the electrical oscillation of the oscillator circuit used in it is not suited for communicating its actual influence state at any time. Therefore, the sensors cannot be used correctly for a certain time; this especially means a considerable limitation for the serviceability of such an inductive sensor when, for example, high-speed movements of articles, for example, in a counting process, must be recognized.

SUMMARY OF THE INVENTION

A primary object of this invention is therefore to embody and develop an oscillator circuit for a sensor such that prompt detection and output of changing influence states of the sensor are possible with the sensor.

The oscillator circuit in accordance with the invention in which the aforementioned object is achieved is characterized, first of all, essentially in that the second terminal of the tuned circuit—at least in terms of AC voltage—is directly connected to the inverting input of the operational amplifier. This special interconnection of the tuned circuit, on the one hand, and the operational amplifier, on the other, results in that the operational amplifier is no longer operated in an amplifier circuit, in which therefore the output of the operational amplifier is fed back by means of a voltage divider to the inverting input of the operational amplifier (negative feedback of the output signal), but it in a comparator circuit in which the polarity of the input voltage at the inverting and noninverting input of the operational amplifier decides about the sudden changeover of the voltage at the output of the operational amplifier.

The oscillator circuit of the invention is advantageous in many ways. On the one hand, due to the absence of negative feedback of the operational amplifier, the full gain of the operational amplifier can be used, for which reason an extremely small voltage difference at the inputs of the operational amplifier leads to prompt changeover of the positive feedback output signal which in a first approximation changes almost without delay between the minimum and maximum output voltage when the sign of the input voltage of the operational amplifier changes. The changeover rate is limited solely by the so-called slew rate.

Another advantage of the oscillator circuit according to the invention is that the electrical oscillation of the tuned circuit, in contrast to the examples known from the prior art, cannot be suppressed by such high attenuation either. This results in that each influence state of the oscillator circuit can be recognized using the electrical oscillation of the tuned circuit; there are therefore no influence areas which cannot be distinguished from one another. However, the same time, this means that the adverse effect of the build-up time of oscillator circuits known from the prior art can no longer occur in the oscillator circuit of the invention, since the continuous presence of an electrical oscillation of the tuned circuit is ensured.

There are a number of possibilities for embodying and developing the teaching of the present invention. Thus, the following remarks are made relative to particular embodiments of the invention, and should not be viewed as being the only possibilities.

The oscillator circuit in accordance with the invention can be further improved with respect to its dynamic behavior by an operational amplifier being used, in one preferred embodiment, which is not frequency response-corrected, and therefore, can be regarded as a special comparator amplifier, instead of a normal operational amplifier. Normal operational amplifiers, which are used mainly as amplifiers with negative feedback of the output signal, generally have internal correction of the frequency response. This means that either the amplitude characteristic of the operational amplifier is reduced in the range of high frequencies, or that the phase characteristic of the operational amplifier is raised for high frequencies, in order to increase the phase margin of the operational amplifier to reduce its tendency toward oscillation for the application as an amplifier. Due to the absence of this correction, the slew rate improves greatly in special comparator amplifiers as compared to conventional frequency response-corrected operational amplifiers; conversely, the comparator amplifier which is advantageous because it switches more quickly cannot, however, be used with oscillator circuits which are known from the prior art.

Another teaching of the invention which acquires special importance is characterized in that the oscillator circuit is equipped with a "build-up aid." Here, a build-up aid does not mean that the electrical oscillation of the oscillator circuit of the invention during normal operation of the circuit could come to a standstill, and therefore, the circuit would require a special starting aid in order to excite the electrical oscillation again. Rather, here, it means that the circuit, when started up, can be in a state which prevents first-time build-up of the oscillator circuit of the invention. This state is avoided in that, between the output of the operational amplifier and the second terminal of the tuned circuit, there is an ohmic voltage divider and the center tap of the voltage divider is connected to the inverting input of the operational amplifier. So that this voltage divider does not act as negative feedback during normal operation of the oscillator circuit, which can be avoided according to the teaching of the invention, the branch of the voltage divider is AC short-circuited between the center tap and the second terminal of the tuned circuit via a capacitor.

Of course, the oscillator circuit described here can be used not only in conjunction with a sensor, but also independently of this application within the framework of any other circuitry task in which oscillators play a part.

In particular, there are various possibilities for embodying and developing the oscillator circuit in accordance with the invention. In this respect reference is made to the description of preferred embodiments in conjunction with the accompanying drawings.

DETAILED DESCRIPTION OF THE INVENTION

The oscillator circuit in accordance with the invention is described below using a preferred embodiment of an inductive sensor. The invention could also be equally well described using any other sensor circuit, such as, for example, using a capacitive sensor which requires the use of an oscillator circuit. Therefore, quite generally, the sole prerequisite for implementation of the invention is simply the necessity of using an oscillator circuit regardless of the purpose which it fulfills in the higher-order circuit.

Figure 5:
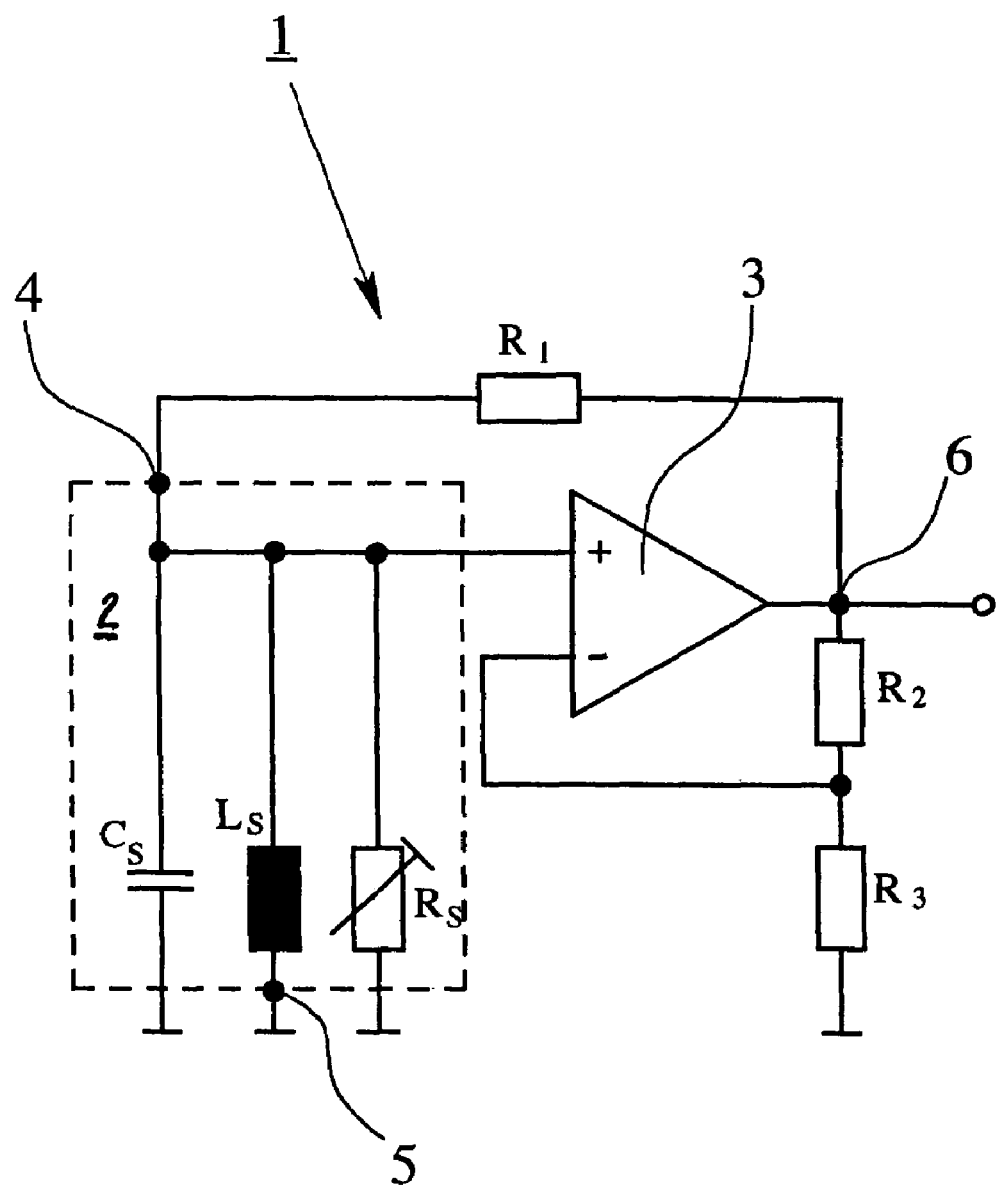
FIG. 5 shows an embodiment of an oscillator circuit known from the prior art.

FIG. 5 shows an oscillator circuit 1 which is known from the prior art and upon which the present invention is based. The oscillator circuit 1 comprises a tuned circuit 2 and an operational amplifier 3. The tuned circuit 2, in this case, is made as a harmonic parallel tuned circuit with a capacitor with a capacitance $C_S$, a coil with an inductance $L_S$ and a resistor $R_S$. The first terminal 4 of the tuned circuit 2 is connected to the noninverting input of the operational amplifier 3 and the output 6 of the operational amplifier 3 is connected, in contrast to the configuration of the oscillator circuit of the invention, via a voltage divider $R_2$, $R_3$ to the inverting input of the operational amplifier 3, i.e., the operational amplifier 3 is operated based on negative feedback of the output 6 in an amplifier circuit. The second terminal 5 of the tuned circuit 2 is connected in FIG. 5 to a fixed reference potential which, however, differs from the potential which lies on the noninverting input of the operational amplifier 3. Furthermore, the output 6 of the operational amplifier 3 is connected via a resistor $R_1$ to the first terminal 4 of the tuned circuit 2 so that the oscillator circuit as shown in FIG. 5 is likewise self-exciting. The resistor $R_S$ of the tuned circuit 2, which resistor is ultimately also responsible for the attenuation of the system, is generally not provided as a separate component, but it arises due to the inevitable losses of the LC tuned circuit $L_S C_S$.

As can be easily seen, the oscillator circuit 1 as shown in FIG. 5 can only form an electrical oscillation when the voltage on the noninverting input of the operational amplifier 3 is greater than the voltage on the inverting input of the operational amplifier 3, therefore, if the condition is satisfied that the ratio of $R_1$ to $R_2$ is less than or equal to the ratio of $R_2$ to $R_3$. If this condition is not satisfied because, for example, in the case of an inductive sensor, the attenuation of the tuned circuit 2 has risen due to eddy current losses in a conductive article (not shown) in the zone of exposure of the coil $L_S$, and thus, has led to a reduction of the resistance $R_S$, the oscillation of the tuned circuit 2 comes to a complete standstill. This has the above described disadvantage that, due to the inevitable build-up time of the oscillator circuit 1, a delay of the readiness of the oscillator circuit 1, and thus, of the inductive sensor, must be tolerated which does not allow its use in applications with high dynamic requirements (high frequency counting processes).

Figure 1:
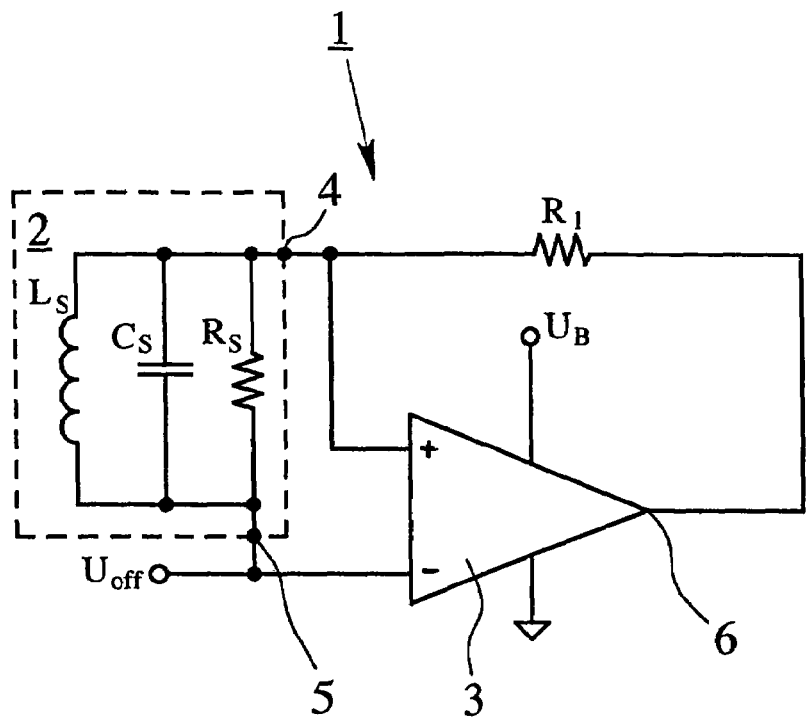
FIG. 1 shows a preferred embodiment of the oscillator circuit in accordance with the invention.

The disadvantages of the oscillator circuit 1 shown in FIG. 5 are, for the most part, avoided by the oscillator circuit of the invention which is shown in FIG. 1.

Here, as shown in FIG. 1, the oscillator circuit 1 also comprises a tuned circuit 2 and an operational amplifier 3 and the first output 4 of the tuned circuit 2 is connected to the noninverting input of the operational amplifier 3 and the second output 5 of the tuned circuit 2 is connected to the inverting input of the operational amplifier 3. In addition, in the preferred embodiment as shown in FIG. 1, only the output 6 of the operational amplifier 3 is fed back via a resistor $R_1$ to the first terminal of the tuned circuit 2, and thus, also electrically connected to the noninverting input of the operational amplifier 3. The supply voltage terminals of the operational amplifier 3 are likewise shown, one terminal being connected to the supply voltage $U_B$ and the other terminal being connected to the ground potential of the circuit.

In an oscillator circuit made in this way, the operational amplifier 3 is no longer operated as an amplifier, but instead functions as a comparator since the voltage difference which arises on the inverting and the noninverting input of the operational amplifier 3 is amplified with the full gain which is characteristic of the operational amplifier 3, and lies at the output 6 of the operational amplifier 3, limited by the operating voltage $U_B$.

Due to the lack of feedback of the output 6 to the inverting input of the operational amplifier 3 and the positive feedback of the output 6 of the operational amplifier, a continuous excitation for oscillation of the tuned circuit 2 is forced; it is not possible to bring the electrical oscillation of the tuned circuit 2 to a standstill by such high attenuation of the tuned circuit 2. It is due to this circumstance that the otherwise conventional build-up times which limit the dynamic behavior of an oscillator circuit 1 known from the prior art do not occur in the oscillator circuit 1 of the present invention. The oscillator circuit 1 in accordance with the invention shown in FIG. 1, therefore, enables much faster, i.e., higher frequency detection of the changing influence states of the tuned circuit 2.

In one especially preferred embodiment (not shown), the operational amplifiers 3 which are ordinarily equipped with frequency response correction are replaced by operational amplifiers which do not have frequency response correction. As has already been explained above, these special operational amplifiers 3, here called comparators, have a much greater slew rate when the output is switched over, by which further improvement of the dynamic behavior of the oscillator circuit 1 of the invention 1 can be achieved.

In other preferred embodiments, as shown in FIGS. 1 to 4, the inverting input of the operational amplifier or comparator amplifier 3 is supplied with an offset voltage $U_{off}$ which preferably has the level of half the operating voltage $U_B$ of the operational amplifier 3. This offset results in that the electrical oscillation of the tuned circuit 2 can take place around the offset voltage. This changes nothing in that, as before, by the execution of the oscillator circuit 1 of the invention, due to the positive feedback of the output 6 of the operational amplifier 3, an electrical oscillation of the tuned circuit 2 is forced.

Figure 2:
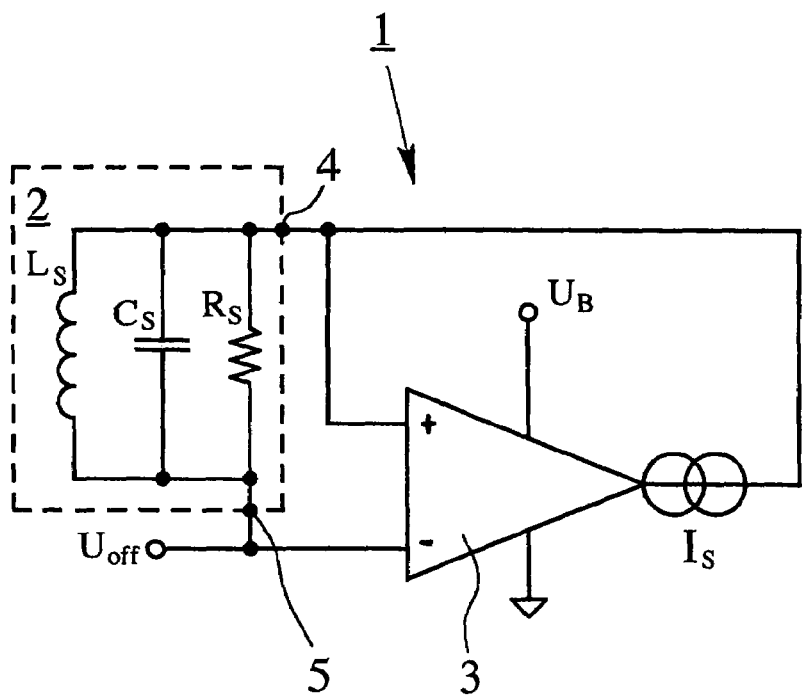
FIG. 2 shows the preferred embodiment of the oscillator circuit with a power source.

FIG. 2 shows an embodiment of the oscillator circuit 1 of the invention in which the feedback resistor $R_1$ is omitted, but for this reason, in the positive feedback branch, a power source $I_S$, especially a voltage-controlled power source $I_S$, is used. This measure is based on the finding that the sensitivity of the circuit as shown in FIG. 1 increases as the value of the feedback resistor $R_1$ becomes greater, but for this purpose, at the same time, the amplitude of the feedback circuit is limited. To counteract this effect, the power source $I_S$ shown in FIG. 2 can be used to trigger the tuned circuit 2.

Figure 3:
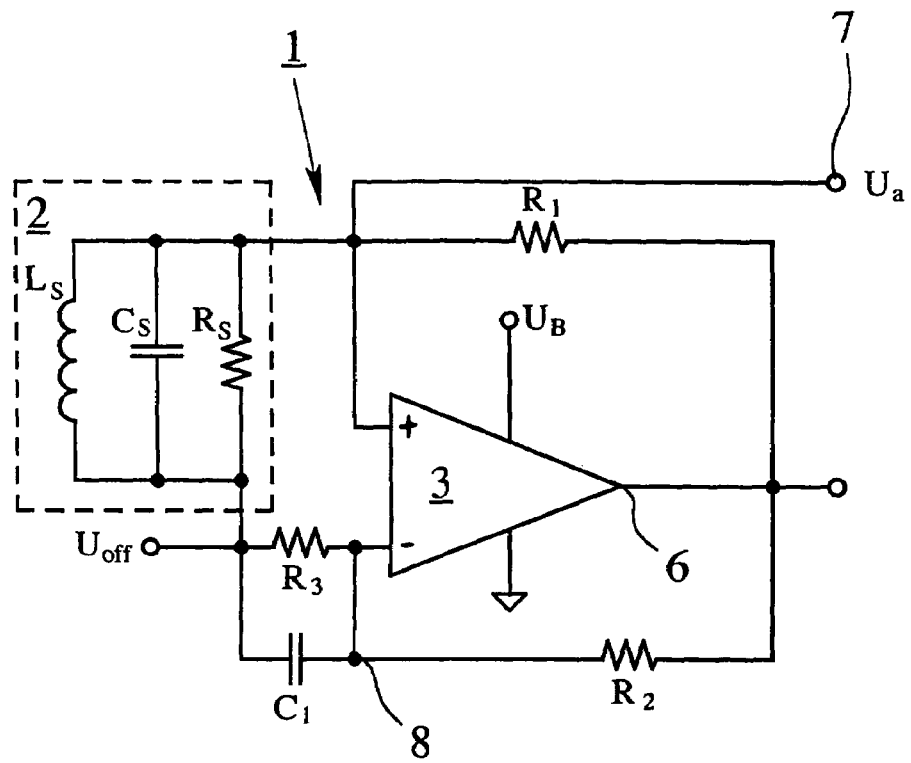
FIG. 3 shows a preferred embodiment of the oscillator circuit in accordance with the invention with a build-up aid.

As has already been stated above, the tuned circuit 2 for the oscillator circuit 1 in accordance with the invention is positively excited to an electrical oscillation for each influence state. Even if not conceivable for normal operation, it is however possible for a new start-up of the oscillator circuit 1 of the invention that the noninverting input of the operational amplifier 3 is at a lower potential than the inverting input of the operational amplifier 3. In this case, a negative output voltage which lies at the output 6 of the operational amplifier 3 is fed back in turn to the tuned circuit, by which the tuned circuit 2 is not excited to oscillate; rather, the circuit remains in this static state. To prevent this, the oscillator circuit 1 of the invention shown in FIG. 3 is provided with a "build-up aid" which comprises an ohmic voltage divider provided between the output 6 of operational amplifier 3 and the second terminal 5 of the tuned circuit 2. The ohmic voltage divider is comprised of the resistors $R_2$, $R_3$, and the center tap 8 of the voltage divider $R_2$, $R_3$ is connected to the inverting input of the operational amplifier 3. Additionally, a branch of the voltage divider $R_2$, $R_3$ is AC short-circuited between the center tap 8 and the second terminal 5 of the tuned circuit 2 via a capacitor $C_1$.

For the above described case in which the tuned circuit 2 does not execute any electrical oscillations, the circuit therefore has only zero-frequency quantities, the voltage divider $R_2$, $R_3$ is fully active, with the result that the negative voltage at the output 6 of the operational amplifier draws the potential on the inverting input of the operational amplifier 3 to under the potential which in the worst case can be on the noninverting input of the operational amplifier 3, the voltage there being determined by the voltage divider which is formed by the resistors $R_1$, $R_3$.

For the case in which the oscillator circuit 1 of the invention shown in FIG. 3 oscillates, the capacitor $C_1$ constitutes an AC short circuit, for which reason the voltage divider which is formed from the resistors $R_2$, $R_3$ is no longer active and the second terminal 5 of the tuned circuit 2 is connected directly, specifically via the capacitor $C_1$, to the inverting connection of the operational amplifier 3, as is provided by the circuits according to the preferred embodiments in FIGS. 1 and 2.

Figure 4:
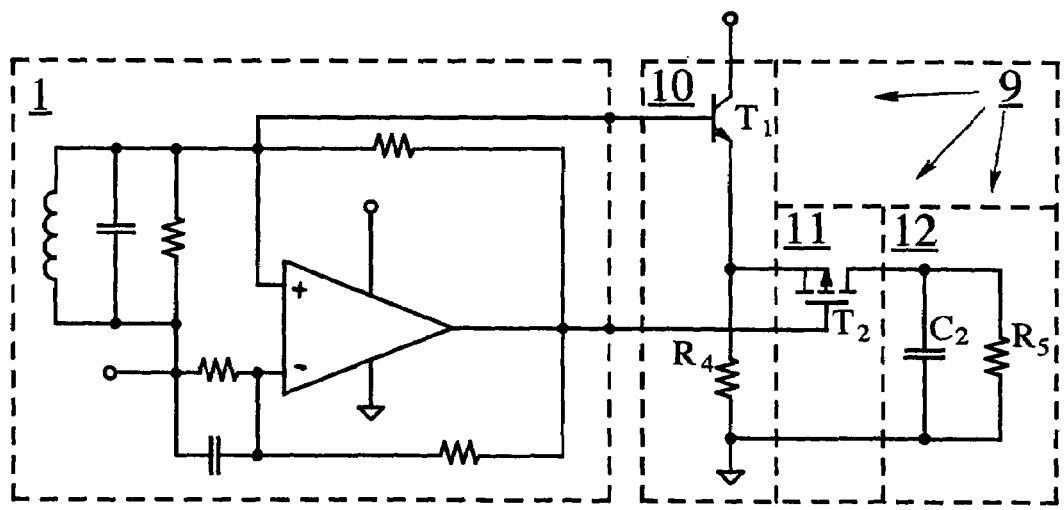
FIG. 4 shows a preferred embodiment of the oscillator circuit with a demodulator circuit connected downstream.

FIG. 4 shows an application of the oscillator circuit 1 of the invention, as can often be found in proximity sensors. The oscillator circuit 1 is connected upstream of a demodulator circuit 9 which is designed to recover the envelope curve, i.e., the actual influence information which has been obtained by the tuned circuit 2, from the amplitude-modulated oscillation of the tuned circuit.

According to the embodiment in FIG. 4, the demodulator circuit 9 has an impedance converter 10, an electronic switch 11 and a low pass filter 12. The input of the impedance converter 10 is connected to the analog output 7 of the oscillator circuit 1 and the electronic switch 11 is actuated by the binary signal at the output 6 of the operational amplifier 3 so that, in the closed state of the electronic switch 11, the output signal of the impedance converter 10 is routed to the input of the low pass filter 12.

Because the output signal at the output 6 of the operational amplifier displays precisely a sign change in the oscillation of the tuned circuit 2 and the electronic switch 11 reacts essentially without delay to this sign change, the switch 11 acts like a synchronous rectifier, by which the simple implementation of a demodulator which is shown in FIG. 4 is possible.

In the embodiment shown in FIG. 4, the impedance converter 10 is implemented by an emitter follower circuit $T_1$, $R_4$, the electronic switch 11 by a MOS field effect transistor $T_2$, and the low pass filter 12 by an RC element $R_5$, $C_2$.

What is claimed is:

1. Oscillator circuit for a sensor, comprising:
   a tuned circuit having a first terminal and a second terminal, and
   an operational amplifier having an inverting input and a noninverting input, the electrical oscillation of the tuned circuit being tapped between the first terminal and the second terminal of the tuned circuit, and the first terminal of the tuned circuit being connected to the noninverting input of the operational amplifier and an output of the operational amplifier being fed back to the noninverting input of the operational amplifier, wherein the second terminal of the tuned circuit, at least in terms of AC voltage, is directly connected to the inverting input of the operational amplifier, and wherein the output of the operational amplifier is fed back via a voltage-controlled power source to the noninverting input of the operational amplifier.

2. Oscillator circuit as claimed in claim 1, wherein the operational amplifier is a special comparator amplifier without frequency response correction.

3. Oscillator circuit as claimed in claim 1, wherein the second terminal of the tuned circuit is connected with an offset voltage in an area of an operating voltage of the operational amplifier.

4. Oscillator circuit in clalm 1, wherein the offset voltage has a level that is half of the operating voltage of the operational amplifier.

5. Oscillator circuit as claimed in claim 1, wherein the output of the operational amplifier is fed back via a resistor to the noninverting input of the operational amplifier.

6. Oscillator circuit as claimed in claim 1, wherein the first terminal of the tuned circuit constitutes an analog output of the oscillator circuit.

7. Oscillator circuit for a sensor, comprising:

a tuned circuit having a first terminal and a second terminal, and an operational amplifier having an inverting input and a noninverting input, the electrical oscillation of the tuned circuit being tapped between the first terminal and the second terminal of the tuned circuit, and the first terminal of the tuned circuit being connected to the noninverting input of the operational amplifier and an output of the operational amplifier being fed back to the noninverting input of the operational amplifier, wherein the second terminal of the tuned circuit, at least in terms of AC voltage, is directly connected to the inverting input of the operational amplifier, and wherein an ohmic voltage divider is provided between the output of the operational amplifier and the second terminal of the tuned circuit, wherein a center tap of the voltage divider is connected to the inverting input of the operational amplifier and wherein a branch of the voltage divider is AC short-circuited between the center tap and the second terminal of the tuned circuit via a capacitor.

8. Oscillator circuit as claimed in claim 1, wherein the oscillator circuit is connected upstream of a demodulator circuit having an impedance converter, an electronic switch and a low pass filter, wherein the input of the impedance converter is connected to an analog output of the oscillator circuit, wherein the electronic switch is actuatable by the output of the operational amplifier, and wherein, in the closed state of the electronic switch, an output signal of the impedance converter is routed to the input of the low pass filter.

9. Oscillator circuit as claimed in claim 8, wherein the impedance converter is implemented by an emitter follower circuit, the electronic switch by a MOS field effect transistor and the low pass by a RC element.

10. Oscillator circuit as claimed in claim 1, wherein said circuit is operative as one of an inductive, capacitive and optoelectronic proximity sensor.

11. Oscillator circuit as claimed in claim 7, wherein the operational amplifier is a special comparator amplifier without frequency response correction.

12. Oscillator circuit as claimed in claim 7, wherein the second terminal of the tuned circuit is connected with an offset voltage in an area of an operating voltage of the operational amplifier.

13. Oscillator circuit as claimed in claim 7, wherein the offset voltage has a level that is half of the operating voltage of the operational amplifier.

14. Oscillator circuit as claimed in claim 7, wherein the first terminal of the tuned circuit constitutes an analog output of the oscillator circuit.

15. Oscillator circuit as claimed in claim 7, wherein the oscillator circuit is connected upstream of a demodulator circuit having an impedance converter, an electronic switch and a low pass filter, wherein the input of the impedance converter is connected to an analog output of the oscillator circuit, wherein the electronic switch is actuatable by the output of the operational amplifier, and wherein, in the closed state of the electronic switch, an output signal of the impedance converter is routed to the input of the low pass filter.

16. Oscillator circuit as claimed in claim 7, wherein said circuit is operative as one of an inductive, capacitive and optoelectronic proximity sensor.

* * * * *